US009890472B2

(12) United States Patent
Wang

(10) Patent No.: US 9,890,472 B2
(45) Date of Patent: Feb. 13, 2018

(54) MONOLITHIC INTEGRATED LATTICE MISMATCHED CRYSTAL TEMPLATE AND PREPARATION METHOD THEREOF

(75) Inventor: Shumin Wang, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 528 days.

(21) Appl. No.: 14/362,130

(22) PCT Filed: Apr. 6, 2012

(86) PCT No.: PCT/CN2012/073572
§ 371 (c)(1),
(2), (4) Date: Sep. 10, 2014

(87) PCT Pub. No.: WO2013/078807
PCT Pub. Date: Jun. 6, 2013

(65) Prior Publication Data
US 2015/0024223 A1 Jan. 22, 2015

(30) Foreign Application Priority Data
Dec. 2, 2011 (CN) .......................... 2011 1 0394410

(51) Int. Cl.
*C30B 19/12* (2006.01)
*H01L 21/02* (2006.01)
(Continued)

(52) U.S. Cl.
CPC ............ *C30B 19/12* (2013.01); *C30B 23/025* (2013.01); *C30B 25/06* (2013.01); *C30B 25/183* (2013.01);
(Continued)

(58) Field of Classification Search
CPC ..... C30B 19/12; C30B 23/025; C30B 25/183; C30B 25/06; C30B 29/403; C30B 29/40;
(Continued)

(56) References Cited

U.S. PATENT DOCUMENTS 6,893,936 B1 *  5/2005  Chen ................. H01L 21/76254
                                                      257/E21.568
2007/0178676 A1 *  8/2007  Oda ................... H01L 21/02381
                                                      438/502

(Continued)

*Primary Examiner* — Jonathan Langman
(74) *Attorney, Agent, or Firm* — Global IP Services; Tianhua Gu

(57) ABSTRACT

The present invention provides a monolithic integrated lattice mismatched crystal template and a preparation method thereof by using low-viscosity material, the preparation method for the crystal template includes: providing a first crystal layer with a first lattice constant; growing a buffer layer on the first crystal layer; below the melting point of the buffer layer, growing a second crystal layer and a template layer by sequentially performing the growth process of a second crystal layer and the growth process of a first template layer on the buffer layer, or growing a template layer by directly performing a first template layer growth process on the buffer layer; melting and converting the buffer layer to an amorphous state, performing a second template layer growth process on the template layer grown by the first template layer growth process at the growth temperature above the glass transition temperature of the buffer layer, sequentially growing a template layer until the lattice of the template layer is fully relaxed. Compared to the prior art, the invention has advantages of simple preparation, achieving in various lattice constant material combinations on one substrate and low dislocation density, high crystal quality.

9 Claims, 7 Drawing Sheets

(51) Int. Cl.
*C30B 23/02* (2006.01)
*C30B 25/18* (2006.01)
*C30B 29/40* (2006.01)
*C30B 25/06* (2006.01)
*C30B 29/68* (2006.01)

(52) U.S. Cl.
CPC ............ *C30B 29/40* (2013.01); *C30B 29/403* (2013.01); *C30B 29/406* (2013.01); *C30B 29/68* (2013.01); *H01L 21/02381* (2013.01); *H01L 21/02395* (2013.01); *H01L 21/02463* (2013.01); *H01L 21/02466* (2013.01); *H01L 21/02546* (2013.01); *H01L 21/02667* (2013.01); *Y10T 428/12681* (2015.01); *Y10T 428/2495* (2015.01); *Y10T 428/31678* (2015.04)

(58) Field of Classification Search
CPC . C30B 29/68; C30B 29/406; H01L 21/02466; H01L 21/02546; H01L 21/02667; H01L 21/02381; H01L 21/02395; H01L 21/02463; Y10T 428/31678; Y10T 428/12681; Y10T 428/2495
See application file for complete search history.

(56) References Cited

U.S. PATENT DOCUMENTS

2008/0241519 A1* 10/2008 Schroeder ......... H01L 21/02381
428/332
2009/0042374 A1* 2/2009 Pawlak ............ H01L 21/02381
438/522

* cited by examiner

MONOLITHIC INTEGRATED LATTICE MISMATCHED CRYSTAL TEMPLATE AND PREPARATION METHOD THEREOF

CROSS REFERENCE TO RELATED PATENT APPLICATION

The present application is the US national stage of PCT/CN2012/073572 filed on Apr. 6, 2012, which claims the priority of the Chinese patent application No. 201110394410.5 filed on Dec. 2, 2011, which application is incorporated herein by reference.

BACKGROUND OF THE PRESENT INVENTION

Field of Invention

The present invention relates to a manufacturing filed of semiconductor devices, and provides a monolithic integrated lattice mismatched crystal template and a preparation method thereof for large, low cost substrates by using low-viscosity material.

Description of Related Arts

1. The world today deduces a major turning point for optoelectronic devices transforming from discrete part to integrate part. Due to various kinds of restrictions and constraints based on the material, structure and process, optoelectronic integration needs to solve a series of essential basic scientific issues to make great strides.

The ideal way to realize optoelectronic integration is growing different kinds of material systems on one material substrate (namely material compatibility), and integrating superior performance of all kinds of materials. For example: silicon (Si) crystal is the most common and inexpensive microelectronic material; but it cannot be used as luminescent material due to that Si is an indirect-band-gap material. While the III-V group semiconductor compound materials, i.e., gallium arsenide (GaAs), indium phosphide (InP), gallium nitride (GaN) and the like, are the most common optoelectronic materials. If the integration of silicon and III-V group material can be achieved, that is, preparing micro-electronics integrate circuit as well as preparing optoelectronic devices on one semiconductor chip, it is expected to promote the development of optoelectronic integration technology.

The modern heteroepitaxial growth techniques, including molecular beam epitaxy technology (MBE) and metal-organic chemical vapor phase epitaxy technology (MOVPE), make it possible to prepare different kinds of crystal heterostructures. Especially in the field of semiconductors, the crystal heterostructure has wide applications in information and communication technology, energy, health, entertainment, information security and daily life. However, due to various crystals have their own lattice constant, only a very limited number of compounds (unless lattice matched) can achieve epitaxial growth on a specific commercial substrate with several tens of nanometers without generating a large number of defects (the defects include dislocations, stacking faults, interface and surface undulation, etc.).

The lack of substrates with arbitrary lattice constant results in that people cannot try all possible combinations of materials, thus being forced to limit the design of device structure on the existing substrates. For example, one of the dreams of the silicon based optoelectronics field is integrating communication laser onto silicon substrate, while the best commercial InGaAsP communication laser is usually grown on InP substrate. The commercial InGaAsP communication laser has poor thermal stability, and requires an external refrigeration device to stabilize the output wavelength, thereby increasing the cost and energy consumption in production and use. The problems will be solved if the laser can be designed and grown on an $In_{0.3}Ga_{0.7}As$ ternary substrate; while such a substrate does not exist on the market. Besides, InSb material has extremely high electron mobility at room temperature, and a high electron mobility transistor by using InSb channel structure may have extremely high work frequency with low power consumption. However, the major problem is still the lack of a suitable substrate. Wide-band-gap III-V material is a very hot research subject recently, and has extremely wide applications especially in high power/high temperature transistors and light-emitting devices from green to ultraviolet band. Once again, the bottleneck to improve the performance of such devices is still high-quality substrate or template with the required lattice constants.

In other applications, some functional devices consist of a plurality of heterogeneous structures with different lattice constants. For example, multi junction photovoltaic solar cell has extremely high conversion efficiency under concentrated sunlight, wherein generally each junction has its own lattice constant. Another example is vertical-cavity surface-emitting laser (VCSEL). People usually need to integrate GaAs/Al(Ga)As distributed Bragg reflector onto a lattice mismatched substrate, i.e., InP and GaSb. Therefore, the requirement of high-quality thin templates for enabling switch from one lattice constant to another lattice constant during single epitaxial growth process (monolithic) exists extensively.

The above problems are well known in the related art. In recent years, a continuous progress has been made for the improvement of the substrate template quality and the attempt for overcoming the lattice mismatch, wherein one of the most successful strategies is to change lattice constant by employing metamorphic buffer layers. Through changing elemental compositions of the polyhydric compound by step or continuously, the strategy may achieve in changing from the lattice constant identical to substrate to that being desired. Recently, a number of optoelectronic devices based on this method have been developed, such as 1.58 µm InGaAs laser on GaAs substrate [I. Tångring et al. Appl. Phys. Lett. 91, 221101 (2007)], wherein the metamorphic growth technique with gradient compounds can be used to reduce threading dislocation density to about $10^6$ $cm^{-2}$, meanwhile, cross-hatch pattern usually appears on the surface, which is not conducive to the growth of a smooth interface. Another method is "interfacial misfit dislocation (IMF) array", that is under certain growth condition, interfacial misfit dislocation array would form at the interface between two crystals with large lattice mismatch [S. H. Huang et al. Appl. Phys. Lett. 88, 131911 (2006)], and generate a very low threading dislocation density ($10^5$ $cm^{-2}$, [A. Jallipalli et al Nanoscale Res. Lett. 4, 1458 (2009)]) and a flat surface; but so far, this method is only valid for binary compounds. Another promising method is a concept of compliant substrate (CS) proposed by Lo [Y. H. Lo, Appl. Phys. Lett. 59, 2311 (1991)], wherein if the compliant substrate template is thin enough, the material layer with lattice mismatch grown on the template would not generate dislocations; if the compliant substrate template is larger than the critical thickness, the generated threading dislocations would penetrate through the compliant substrate template instead of epitaxial layer. Herein, the critical step is to create an interface (or buffer layer) between the compliant substrate template and a support layer below, such that the compliant substrate template can slide freely on the interface. There are several methods to achieve this kind of buffer layer/interface. In the U.S. Pat. No. 5,294,808 (invention title: Pseudomorphic and dislocation free heteroepitaxial structures) belonging to Lo as the inventor, the compliant substrate template consists of a very thin membrane structure or platform shaped structure, but such method needs complicated preparation process and is hard to achieve large size. While another U.S. Pat. No. 5,981,400 by inventor Lo (invention title: Compliant universal substrate for epitaxial growth) provides a more general method, that is reversing bonding, which method can deal with very lager lattice mismatch, but needs to perform bonding and etching prior to growth. Due to the bonding process is very complicated, it is difficult to achieve preparation with large size, and the residual stress and surface undulation of the thin layer are large. The U.S. Pat. No. 6,372,356 (invention title: Compliant substrates for growing lattice mismatched films) by inventors of Thorton et al. provides that an amorphous buffer layer is arranged below a compliant substrate, which is accomplished by first growing a cap layer (e.g. AlAs) followed by the process of photolithography and oxidation. Such method has been used to grow the relevant GaN heterostructures on a GaAs substrate. While in the U.S. Pat. No. 6,746,777 (invention title: Alternative substrates for epitaxial growth), the inventor Hwang employs metal-interface bonding layer, wherein such metals are solid at room temperature, and are converted to liquid at the growth temperature. Such method needs bonding and etching prior to growth. In the US patent application US2004/0140479 (invention title: Compliant substrate for a heteroepitaxial structure and method for making same), the inventor Akatsu constructs a weakened buffer layer to realize a compliant substrate by employing ion implantation. However, all abovementioned approaches need to perform external process to achieve a compliant growth condition, and cannot be repeated in the same epitaxial growth process.

There is another strategy that is first generating a plurality of dislocations to fully relax the lattice mismatched layer, then reducing defect density by new method. In the U.S. Pat. No. 6,784,074 (invention title: Defect-free semiconductor templates for epitaxial growth and method of making same), inventors Shchukin and Ledentzov provide a approach to reduce defects, which is first growing a special selection of material layer with low thermal evaporation rate, then covering a thin layer with high thermal evaporation rate, and followed by performing thermal evaporation and subsequent growth. Such method has good effect for specific materials, but more material combinations are hard to obtain.

To sum up, the above methods have its disadvantages to solve the lattice mismatch issue.

SUMMARY OF THE PRESENT INVENTION

The object of the present invention is to provide a monolithic integrated lattice mismatched crystal template and a preparation method thereof by using low-viscosity material, to solve the problems of complicated process, limited material combinations and low crystal quality etc., in the existing heteroepitaxial growth technology.

The present invention provides a monolithic integrated lattice mismatched crystal template by using low-viscosity material, including: a first crystal layer having a first lattice constant; a buffer layer located on the first crystal layer, the buffer layer melting and converting to an amorphous state above its melting point; a template layer located on the buffer layer and having a second lattice constant, which differs from the first lattice constant of the first crystal layer; the lattice of the template layer being fully relaxed in the growth at a temperature above the glass transition temperature of the buffer layer.

Optionally, the crystal template further includes: a second crystal layer located between the buffer layer and the template layer, the second crystal layer has lattice mismatch relative to the buffer layer and is partially relaxed or strained.

Optionally, the second crystal layer is selected from anyone of the C, Si, Ge, Sn, binary and multiple semiconductors, oxides, and other inorganic crystals with arbitrarily crystal orientation.

Optionally, the first crystal layer is a semiconductor substrate, a heterostructure material or a functional device consisting of heterostructure materials with arbitrarily crystal orientation.

Optionally, the first crystal layer is selected from anyone of the C, Si, Ge, Sn, binary and multiple semiconductors, oxides, and other inorganic crystals with arbitrarily crystal orientation.

Optionally, melting point of the buffer layer is lower than the melting point of any one of the first crystal layer, the second crystal layer and the template layer of the crystal template.

Optionally, the buffer layer has a thickness of nanometer order, and is strained or partially or fully relaxed relative to the first crystal layer.

Optionally, the thickness of the template layer is greater than that of the buffer layer.

Optionally, the total thickness of the second crystal layer and the template layer is much greater than the thickness of the buffer layer.

Optionally, the thickness of the second crystal layer should meet the requirement that being smaller relative to the critical thickness of the infinitely thick template layer, or ensure that the dislocations generated at the interface between the second crystal layer and the template layer bend towards to the second crystal layer.

Optionally, the template layer is selected from anyone of the C, Si, Ge, Sn, binary and multiple semiconductors, oxides, and other inorganic crystals with arbitrarily crystal orientation.

The present invention further provides a preparation method for a monolithic integrated lattice mismatched crystal template by using low-viscosity material, including: providing a first crystal layer with a first lattice constant; growing a buffer layer on the first crystal layer, the buffer layer being grown at a temperature below its melting point on the first crystal layer; performing a first template layer growth process at a temperature below the melting point of the buffer layer, and growing a template layer on the buffer layer, wherein the template layer has a second lattice constant, which differs from the first lattice constant of the first crystal layer; melting and converting the buffer layer to an amorphous state, performing a second template layer growth process on the template layer which has been grown via the first template layer growth process at a growth temperature above the glass transition temperature of the buffer layer, sequentially growing a template layer until the lattice of the template layer is fully relaxed.

Optionally, prior to performing a first template layer growth process, the method further includes: growing a second crystal layer on the buffer layer at a temperature below the melting point of the buffer layer, the second crystal layer has lattice mismatch relative to the buffer layer and is partially relaxed or strained.

Optionally, melting point of the buffer layer is lower than the melting point of any one of the first crystal layer, the second crystal layer and the template layer of the crystal template.

Optionally, the buffer layer has a thickness of nanometer order, and is strained or partially or fully relaxed relative to the first crystal layer.

Optionally, the total thickness of the second crystal layer and the template layer is much greater than the thickness of the buffer layer.

Optionally, the thickness of the second crystal layer should meet the requirement that being smaller relative to the critical thickness of the infinitely thick template layer, or ensure that the dislocations generated at the interface between the second crystal layer and the template layer bend towards to the second crystal layer.

Optionally, the step of melting the buffer layer and then converting to an amorphous state is achieved by either of the following ways: raising the temperature of the buffer layer to above the melting point of the buffer layer, such that the buffer layer melts and converts to an amorphous state; selectively melting the buffer layer to convert to an amorphous state by employing an external laser.

Optionally, the preparation method for the crystal template allows reuse during the same growth process.

Optionally, the preparation method for the crystal template is achieved by any of the epitaxial growth methods including molecular beam epitaxy (MBE), metal-organic vapor phase epitaxy (MOVPE), liquid phase epitaxy (LPE), hot wall epitaxy (HWE), and modified deposition modes including droplet epitaxy, migration enhanced epitaxy, atomic layer epitaxy, and sputtering, pulsed laser deposition, and other crystal deposition techniques by using evaporation element or ion beam.

The monolithic integrated lattice mismatched crystal template and the preparation method thereof by using low-viscosity material provided by the present invention is that, preparing a compliant substrate template with low dislocation density and arbitrary lattice constant combination on a common substrate by using a thin melting buffer layer in the heteroepitaxial growth. Compared to the prior art, the invention has advantages of simple preparation, achieving in various lattice constant material combinations on one substrate and low dislocation density, high crystal quality.

DETAILED DESCRIPTION OF THE PREFERRED EMBODIMENTS

Figure 1:
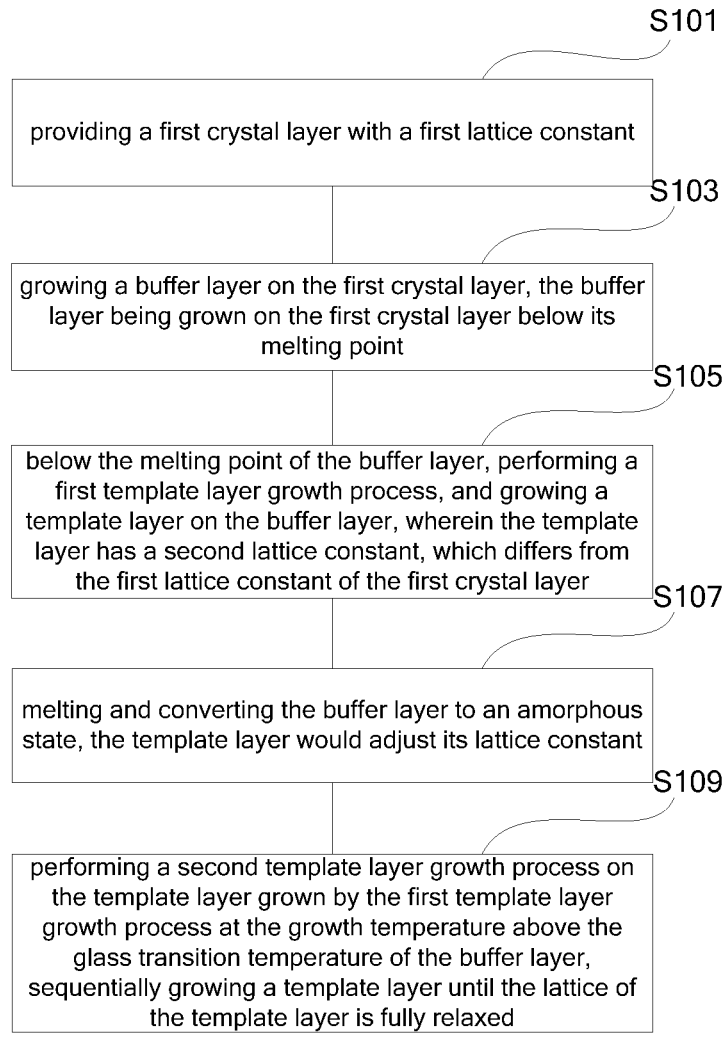
FIG. 1 is a flow diagram of the first embodiment of the preparation method for a lattice mismatched crystal template of the present invention.

The inventors of the present invention found that: as for the existing heteroepitaxial growth technology, since different crystals have different lattice constants, it would form defects, such as dislocations, stacking faults, interface or surface undulation, etc., during the heteroepitaxial growth on a substrate. While employing other buffer layer technologies or other compliant substrate technologies, it inevitably exists problems of complicated process, limited material combination and low crystal quality. Therefore, in order to avoid the generation of the above defects, the inventors of the present invention have improved the prior art, and provide a novel lattice mismatched crystal template and the preparation method thereof, that is preparing a compliant substrate template with low dislocation density and arbitrary lattice constant combinations on a common substrate by using a thin melted buffer layer in the heteroepitaxial growth. Compared to the prior art, the present invention has advantages of simple preparation, achieving in various lattice constant material combinations on one substrate and low dislocation density, high crystal quality.

The present invention is applicable in semiconductors, oxides and any other crystal heterostructures, including light emitting diodes, various types of semiconductor lasers, photodetectors, optical modulators, solar cells, bipolar transistors, field effect transistors, varactor diodes and the like. The preparation method is applicable in a variety of materials, including C, Si, Ge, Sn, nitride, arsenide, phosphide, antimonide, II-VI, IV-VI, V-VI, oxides and other inorganic heterostructures. Besides, the present invention can be achieved by the following techniques: epitaxial growth methods (molecular beam epitaxy (MBE), metal-organic vapor phase epitaxy (MOVPE), liquid phase epitaxy (LPE), hot wall epitaxy (HWE), and the like), modified deposition modes (droplet epitaxy, migration enhanced epitaxy, atomic layer epitaxy, and the like), sputtering, pulsed laser deposition, and other crystal deposition techniques by using evaporation element or ion beam, etc.

The present invention is more completely described hereunder in conjunction with the drawings, and people skilled in the art may easily understand the advantages and efficacies of the present invention from the contents disclosed in the present description. The present invention provides preferred embodiments, but should not be considered to be limited in the embodiments set forth herein. In the drawings, in order to more clearly reflect the device structure, it appropriately enlarges the thickness of layers and regions, but as schematic diagrams, it should not be considered to strictly reflect the scaling relation of geometric dimensioning. The reference diagrams are schematic diagrams of the invention, and the representation in the drawings is just schematic, but should not be considered to limit the scope of the invention.

First Embodiment

FIG. 1 is a flow diagram of the first embodiment of the preparation method for a lattice mismatched crystal template of the present invention. As shown in FIG. 1, the preparation method includes the following steps:

Step S101, providing a first crystal layer with a first lattice constant;

Step S103, growing a buffer layer on the first crystal layer, the buffer layer being grown on the first crystal layer at a temperature below the melting point of the buffer layer;

Step S105, below the melting point of the buffer layer, performing a first template layer growth process, and growing a template layer on the buffer layer, wherein the template layer has a second lattice constant, which differs from the first lattice constant of the first crystal layer;

Step S107, melting and converting the buffer layer to an amorphous state, the template layer would adjust its lattice constant.

Step S109, performing a second template layer growth process on the template layer grown by the first template layer growth process at the growth temperature above the glass transition temperature of the buffer layer, sequentially growing a template layer until the template layer is fully relaxed in the growth.

Hereinafter, each step abovementioned is described in detail.

Figure 2:
FIGS. 2 to 6 are schematic diagrams based on the preparation procedure for the crystal template in FIG. 1.

First, perform step S101, provide a first crystal layer 10 with a first lattice constant, to form the structure as shown in FIG. 2.

In this embodiment, the first crystal layer 10 can be any type of semiconductor substrates, heterostructure materials or functional devices consisting of heterostructure materials. The material of the first crystal layer 10 can be selected from any one of the C, Si, Ge, Sn, binary and multiple semiconductors, oxides, and other inorganic crystals.

Figure 3:
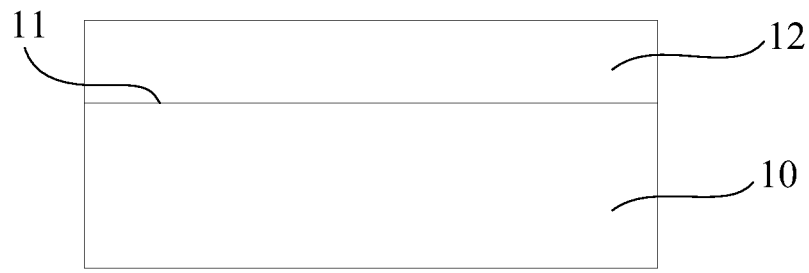

Then, perform step S103, grow a buffer layer 12 on the first crystal layer 10, to form the structure as shown in FIG. 3.

As shown in FIG. 3, the buffer layer 12 forms a smooth interface 11 after growing on the first crystal layer 10.

In the step S103, the inventors of the present invention creatively provide a thin melted buffer layer as a conversion layer. In the embodiment, the buffer layer 12 is a low viscosity material, and has lower melting point relative to the first crystal layer 10 and other layers grown subsequently, namely, the melting point of the buffer layer 12 is much lower than the melting point of any layer of the first crystal layer 10 and other layers (e.g., template layer) grown subsequently. When performing the growth in step S103, the buffer layer 12 is grown at a temperature below its melting point on the first crystal layer 10. Besides, the selection of the materials of the buffer layer 12 should meet the requirement of having lattice mismatch with the first crystal layer 10 and other layers grown subsequently; that is firstly, all thin layers to be used should be as smooth as possible, which can be achieved such as by the following methods: the use of interfacial misfit dislocation array, surfactants, and suppressing the diffusion of adsorbed atoms by low growth temperature and the like; secondly, keep lowest possible threading dislocation density, since the achievement of the low threading dislocation density are well known prior arts for those persons skilled in the art, e.g., the related dislocation filtering technology can be found from the literature, and not need to list herein.

Moreover, in the embodiment, the buffer layer 12 has a thickness of nanometer order, and is strained or partially or fully relaxed relative to the first crystal layer 10.

Figure 4:
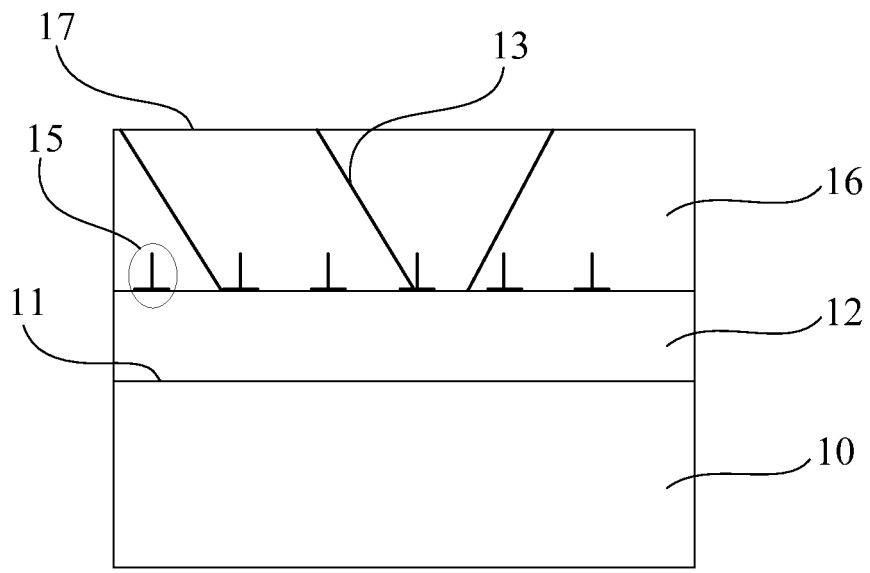

Then, perform step S105, below the melting point of the buffer layer, perform a first template layer growth process, and grow a template layer 16 on the buffer layer 12, to form the structure in FIG. 4.

In this embodiment, the template layer 16 has a second lattice constant, which differs from the first lattice constant of the first crystal layer 10. As shown in FIG. 4, the thickness of the template layer 16 is greater than that of the buffer layer 12. The template layer can be strained or partially relaxed through the formation of misfit dislocations 15 (only misfit dislocations perpendicular to the paper direction are shown in FIG. 4) and threading dislocations 13. Herein, the most important thing is, the template layer 16 should keep to the lowest threading dislocation 13 density and smooth surface. Besides, the interface 17 of the template layer 16 should be thermally stable at the temperature for melting the buffer layer 12.

In the embodiment, the template layer 16 can be selected from anyone of the C, Si, Ge, Sn, binary and multiple semiconductors, oxides, and other inorganic crystals.

Figure 5:
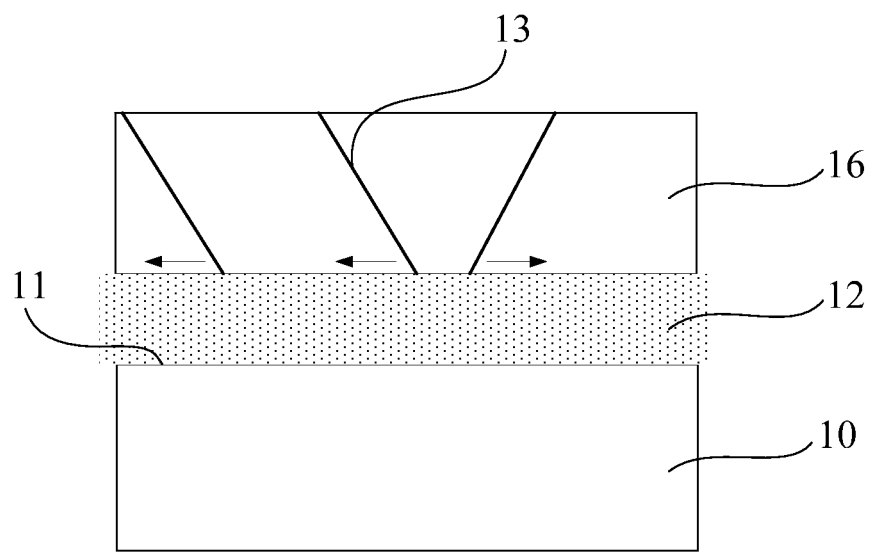

Then, perform step S107, raise the temperature of buffer layer 12 to above its melting point, to melt and convert the buffer layer 12 to an amorphous state, to form the structure in FIG. 5.

In the embodiment, melting the buffer layer 12 and then converting to an amorphous state is achieved by raising the temperature to above the melting point of the buffer layer 12, namely, after raising the growth temperature to above the melting point of the buffer layer 12, the buffer layer 12 would convert to a liquid state with low viscosity (as shown in FIG. 5). Of course, in practical application, the buffer layer 12 is not limited thereto the melting process, and the above melting process can be achieved by other ways, e.g., selectively melting the buffer layer 12 by employing an external laser without affecting the crystal quality of other layers.

In the case of the melting of the buffer layer 12, the template layer 16 upon the buffer layer 12 becomes self-supporting and adjusts overall lattice in accordance with its thickness and lattice mismatch. The residual stress in the template layer 16 drives the threading dislocations 13 to glide to the edge of the sample or annihilates one another with the threading dislocations with opposite Burgers vector, thereby forming a relaxed template layer 16 with low threading dislocation density.

Figure 6:
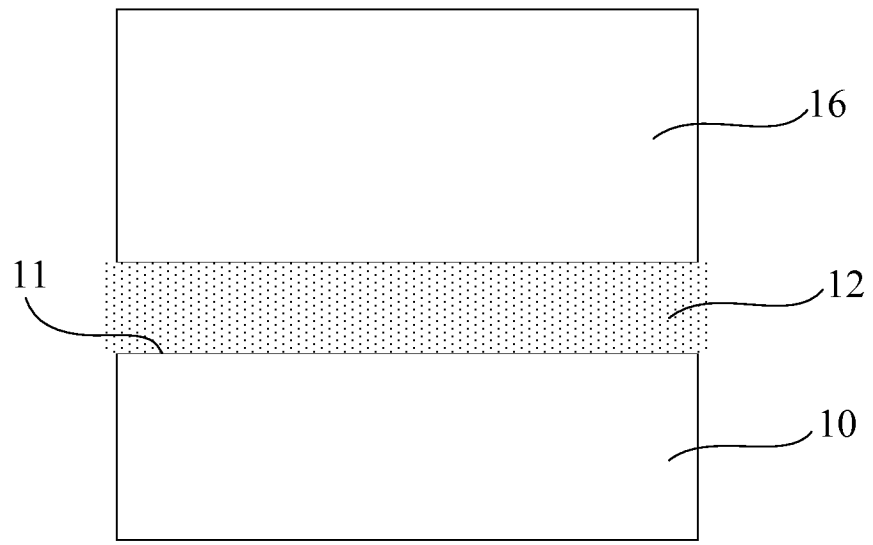

Then, perform step S109, perform a second template layer growth process at the growth temperature above the glass transition temperature of the buffer layer 12; sequentially grow a template layer 16 on the template layer 16 grown in the growth process of the first template layer (herein, the material of the template layer with a first thickness is the same as the template layer with a second thickness, thereby applying the same mark number), until the template layer 16 is fully relaxed during the growth above the melting point of the buffer layer 12, to form the structure as shown in FIG. 6.

In the embodiment, the growth temperature in step S109, preferably, remains at a certain temperature above the melting point of the buffer layer 12, to ensure that the interface between the buffer layer 12 and the template layer 16 is a free interface or a weaken interface. When the template layer 16 reaches a sufficient thickness, it would be almost fully relaxed. But not to be limited, in fact, the growth temperature in step S109 being around the melting point of the buffer layer 12 while above the glass transition temperature of the buffer layer 12 would have the same or similar effect.

In the first embodiment abovementioned, the present invention creatively provides a pre-grown buffer layer with low melting point and thickness of nanometer order on a common substrate; partial template layer is grown below the melting point of the buffer layer; then, the temperature is raised to above the melting point of the buffer layer, such that the buffer layer melts and converts to an amorphous state, and the template layer upon the buffer layer performs thermal annealing and adjusts the lattice constant thereof; then, strain would ultimately drives the threading dislocations to the edge of the sample or annihilates one another; finally, the template layer is sequentially grown at the growth temperature above the glass transition temperature of the buffer layer; when the template layer reaches a sufficient thickness, it would be almost fully relaxed, thereby preparing a compliant substrate template with low dislocation density and arbitrary lattice constant combination on a common substrate.

Second Embodiment

Figure 7:
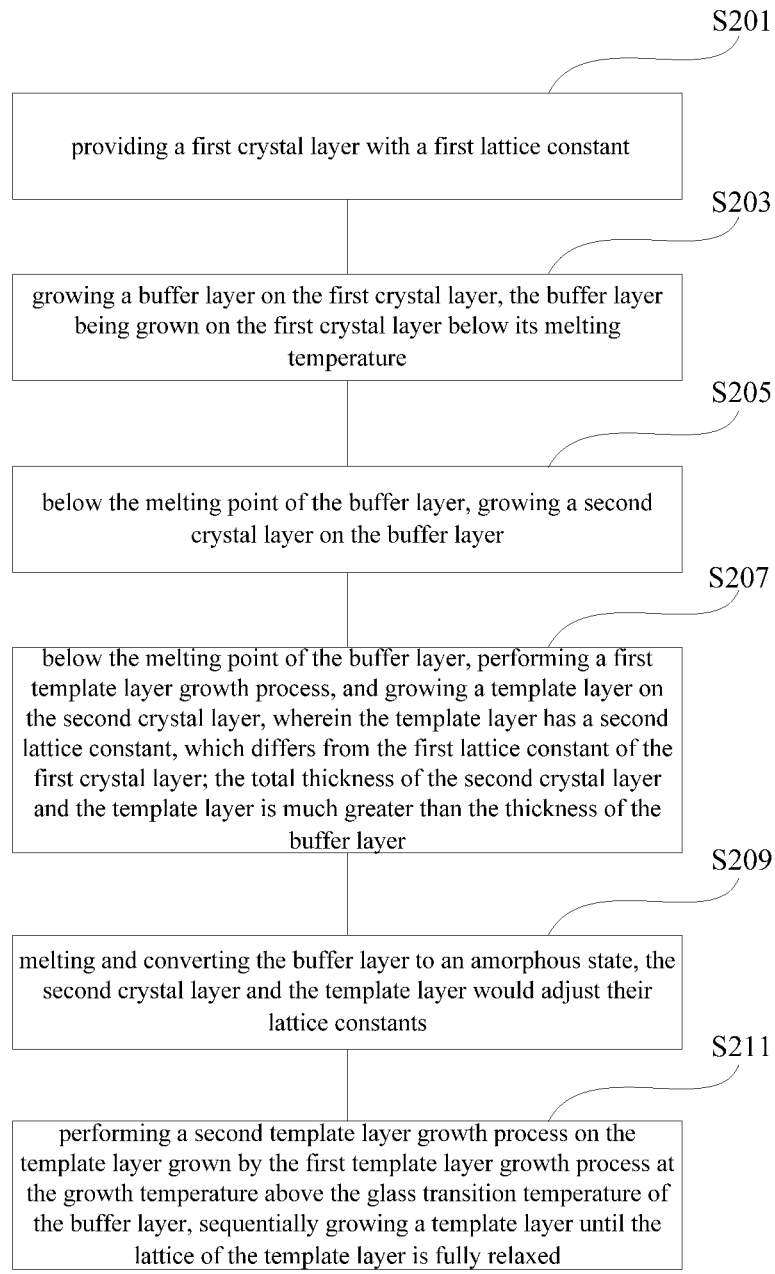
FIG. 7 is a flow diagram of the second embodiment of the preparation method for a lattice mismatched crystal template of the present invention.

FIG. 7 is a flow diagram of the second embodiment of the preparation method for a lattice mismatched crystal template of the present invention. It should be particularly stated that, since some process steps in the second embodiment is the same or similar with that in the first embodiment, the description in the second embodiment would focus on the part distinguished from that in the first embodiment.

As shown in FIG. 7, the preparation method includes the following steps:

Step S201, providing a first crystal layer with a first lattice constant;

Step S203, growing a buffer layer on the first crystal layer, the buffer layer being grown on the first crystal layer at a temperature below its melting point;

Step S205, below the melting point of the buffer layer, growing a second crystal layer on the buffer layer;

Step S207, below the melting point of the buffer layer, performing a first template layer growth process, and growing a template layer on the second crystal layer, wherein the template layer has a second lattice constant, which differs from the first lattice constant of the first crystal layer; the total thickness of the second crystal layer and the template layer is much greater than the thickness of the buffer layer.

Step S209, melting and converting the buffer layer to an amorphous state, the second crystal layer and the template layer would adjust their lattice constants.

Step S211, performing a second template layer growth process on the template layer grown by the first template layer growth process at the growth temperature above the glass transition temperature of the buffer layer, sequentially growing a template layer until the template layer is fully relaxed in the growth.

Hereinafter, each step abovementioned is described in detail.

Figure 8:
FIGS. 8 to 14 are schematic diagrams based on the preparation procedure for the crystal template in FIG. 1.

First, perform step S201, provide a first crystal layer 20 with a first lattice constant, to form the structure as shown in FIG. 8.

In this embodiment, the first crystal layer 20 can be any type of semiconductor substrates, heterostructure materials or functional devices consisting of heterostructure materials. The material of the first crystal layer 20 can be selected from any one of the C, Si, Ge, Sn, binary and multiple semiconductors, oxides, and other inorganic crystals.

Figure 9:
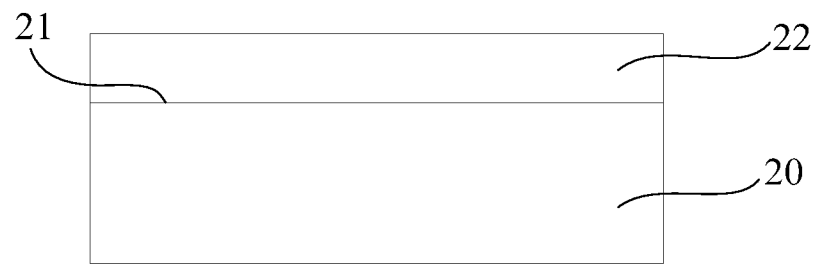

Then, perform step S203, grow a buffer layer 22 on the first crystal layer 20, to form the structure as shown in FIG. 9.

As shown in FIG. 9, the buffer layer 20 forms a smooth interface 21 after growing on the first crystal layer 20.

In the step S203, the inventors of the present invention creatively provide a thin melted buffer layer as a conversion layer. In the embodiment, the buffer layer 22 is a low viscosity material, and has lower melting point relative to the first crystal layer 20 and other layers grown subsequently, namely, the melting point of the buffer layer 22 is much lower than the melting point of any layer of the first crystal layer 20 and other layers (e.g., a second crystal layer and a template layer) grown subsequently. When performing the growth in step S203, the buffer layer 22 is grown at a temperature below its melting point on the first crystal layer 20. Besides, the selection of the materials of the buffer layer 22 should meet the requirement of having lattice mismatch with the first crystal layer 20 and other layers grown subsequently; that is firstly, all thin layers to be used should be as smooth as possible, which can be achieved such as by the following methods: the use of interfacial misfit dislocation array, surfactants, and suppressing the diffusion of adsorbed atoms by low growth temperature and the like; secondly, keep lowest possible threading dislocation density, since the achievement of the low penetration dislocation density are well known prior arts for those persons skilled in the art, e.g., the related dislocation filtering technology can be found from the literature, and not need to list herein.

Moreover, in the embodiment, the buffer layer 22 has a thickness of nanometer order, and is strained or partially or fully relaxed relative to the first crystal layer 20.

Then, perform step S205, below the melting point of the buffer layer, grow a second crystal layer 24 on the buffer layer 12, to form the structure in FIG. 10.

Figure 10:
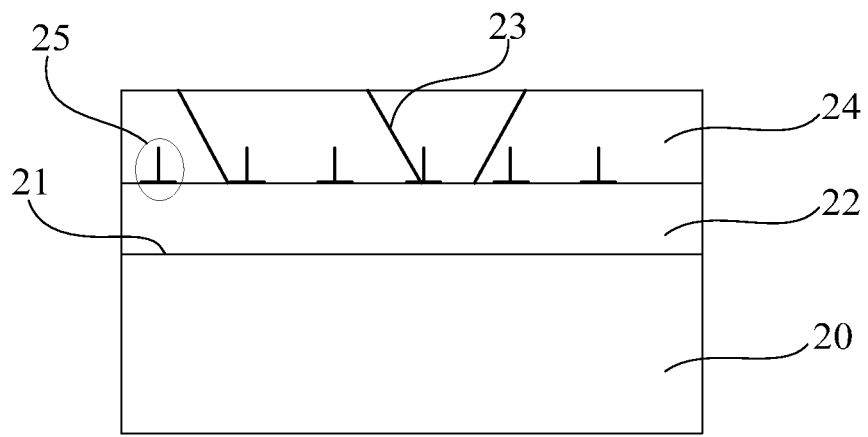

In this embodiment, as shown in FIG. 10, the second crystal layer 24 has lattice mismatch relative to the buffer layer 22, and can be strained or partially relaxed through the fromation of misfit dislocations 25 (only misfit dislocations perpendicular to the paper direction are shown in FIG. 10) and threading dislocations 23. Herein, the most important thing is, the second crystal layer 24 should keep to the lowest threading dislocation 23 density and smooth surface.

Besides, in the embodiment, the material of the second crystal layer 24 can be selected from anyone of the C, Si, Ge, Sn, binary and multiple semiconductors, oxides, and other inorganic crystals.

Then, perform step S207, below the melting point of the buffer layer, perform a first template layer growth process, and grow a template layer 26 on the second crystal layer, to form the structure in FIG. 11.

In this embodiment, the template layer 26 has a second lattice constant, which differs from the first lattice constant of the first crystal layer 20.

Figure 11:
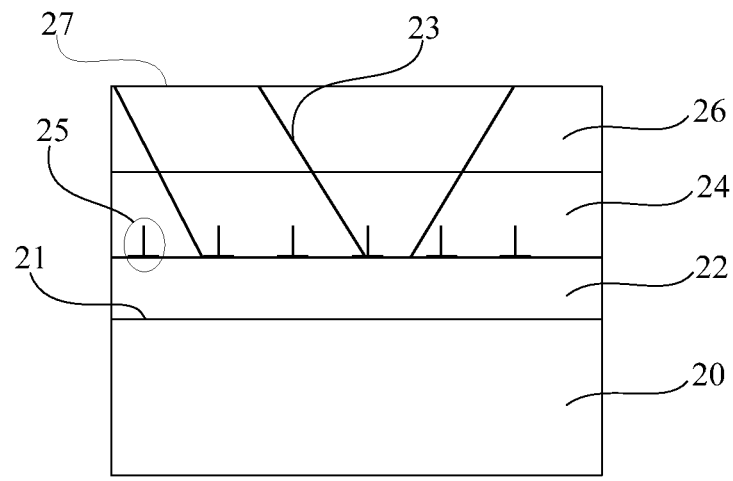

It should be noted that, as shown in FIG. 11, the total thickness of the second crystal layer 24 and the template layer 26 is much larger (generally a few times, or even more) than the thickness of the buffer layer 22 (generally, the thickness of the template layer 26 is larger than that of the second crystal layer 24), to ensure the mechanical strength in the sequentially melting process of the buffer layer 22. Besides, in accordance with the requirement of the compliant substrate (CS) [Y. H. Lo, Appl. Phys. Lett. 59, 2311 (1991)], the thickness of the second crystal layer should meet the requirement that being smaller relative to the critical thickness of the infinitely thick template layer, or ensure that the dislocations generated at the interface between the second crystal layer and the template layer bend towards to the second crystal layer.

Please refer to FIG. 11, the template layer 26 has lattice mismatch relative to the second crystal layer 24 and remains fully strained, while the existing threading dislocations would thread through the template layer and terminate at the interface 27 of the template layer away from the second crystal layer 24.

In the embodiment, the template layer 26 is selected from anyone of the C, Si, Ge, Sn, binary and multiple semiconductors, oxides, and other inorganic crystals.

Figure 12:
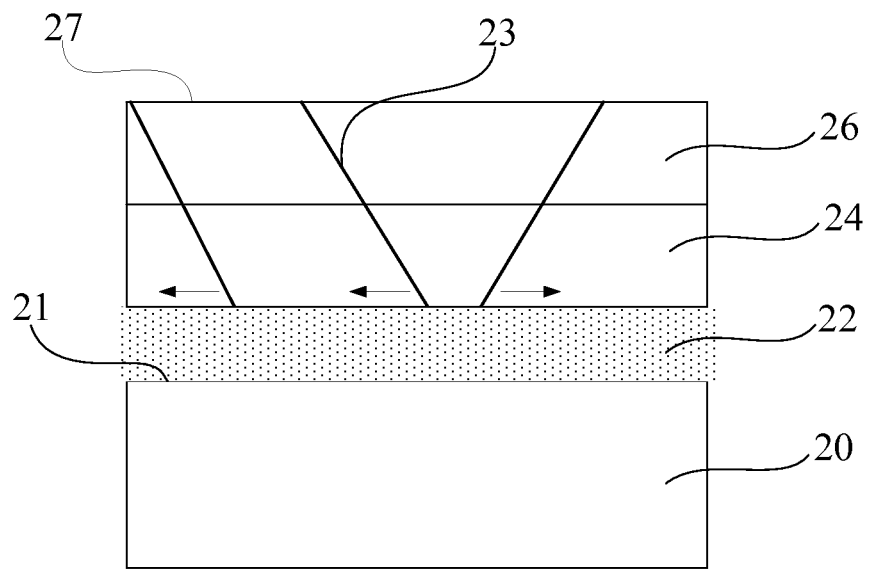

Then, perform step S209, raise the temperature of buffer layer 22 to above its melting point, to melt and convert the buffer layer 22 to an amorphous state, to form the structure in FIG. 12.

In the embodiment, melting the buffer layer 22 and then converting to an amorphous state is achieved by raising the temperature to above the melting point of the buffer layer 22, namely, after raising the growth temperature to above the melting point of the buffer layer 22, the buffer layer 22 would convert to a liquid state with low viscosity (as shown in FIG. 12). Of course, in practical application, the buffer layer 22 is not limited thereto the melting process, and the above melting process can be achieved by other ways, e.g., selectively melting the buffer layer 22 by employing an external laser without affecting the crystal quality of other layers.

In the case of the melting of the buffer layer 22, the second crystal layer 24 and the template layer 26 upon the buffer layer 12 become self-supporting and adjust overall lattices in accordance with its thickness and lattice mismatch.

Then, perform step S211, perform a second template layer growth process at the growth temperature above the glass transition temperature of the buffer layer 22; sequentially grow a template layer 26 on the template layer 26 grown in the growth process of the first template layer (herein, the material of the template layer with a first thickness is the same as the template layer with a second thickness, thereby applying the same mark number), until the template layer 26 is fully relaxed during the growth above the melting point of the buffer layer 22.

In the embodiment, the growth temperature in step S211, preferably, remains at a certain temperature above the melting point of the buffer layer 22, but not to be limited, in fact, the growth temperature in step S211 being around the melting point of the buffer layer 22 while above the glass transition temperature of the buffer layer 22 would have the same or similar effect.

Figure 13:
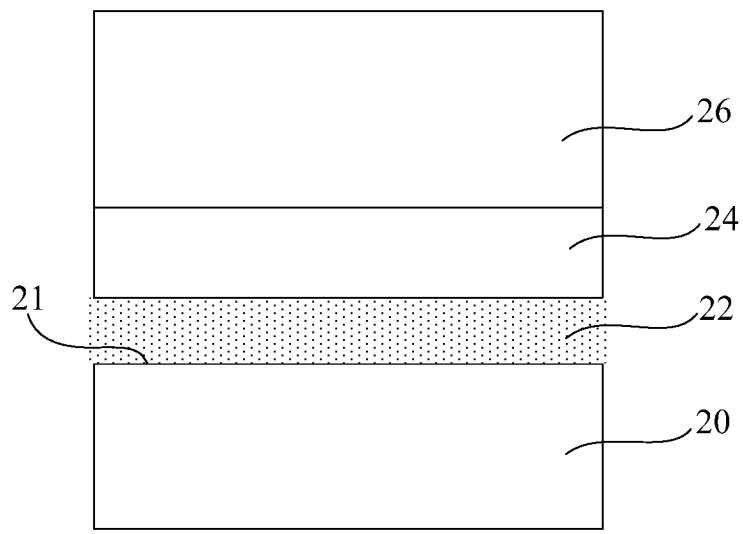
Figure 14:
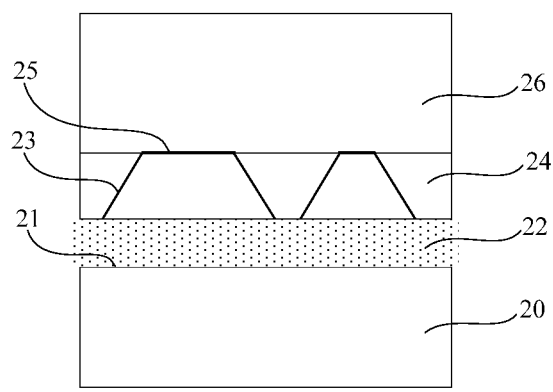

In the embodiment, according to the aforementioned thickness requirements of the second crystal layer and template layer, it can be divided into two situations further in accordance with the thickness of the second crystal layer 24: first situation, the thickness of the second crystal layer 24 is very thin, that is smaller than the critical thickness relative to the infinitely thick template layer 26, correspondingly, the template layer 26 should be thick enough to meet the requirement that the total thickness of the second crystal layer 24 and the template layer 26 is much larger (generally a few times, or even more) than that of the buffer layer 22; during the growth process of the template layer 26, the residual stress in the template layer 26 drives the threading dislocations 23 to glide to the edge of the sample or annihilates one another with the threading dislocations with opposite Burgers vector, thereby the template layer 26 achieves in fully relaxation (forming the structure as shown in FIG. 13) when it reaches a sufficient thickness. Second situation, the thickness of the second crystal layer 24 is thick but still smaller than that of the template layer 26, such that the residual stress of the template layer 26 makes the generated threading dislocations 23 bend towards to the second crystal layer 24, thereby the template layer 26 achieves in fully relaxation (forming the structure as shown in FIG. 14) when it reaches a sufficient thickness.

In the second embodiment abovementioned, the present invention creatively provides a pre-grown buffer layer with low melting point and thickness of nanometer order on a common substrate; a second crystal layer and partial template layer is grown below the melting point of the buffer layer; then, the temperature is raised to above the melting point of the buffer layer, such that the buffer layer melts and converts to an amorphous state, as well as the second crystal layer and the template layer upon the buffer layer performs thermal annealing and adjusts the lattice constant thereof; then, according to the thickness of the second crystal layer, strain would ultimately drives the threading dislocations to the edge of the sample, or annihilates one another, or makes the generated threading dislocations 23 bend towards to the second crystal layer 24; finally, the template layer is sequentially grown at the growth temperature above the glass transition temperature of the buffer layer; when the template layer reaches a sufficient thickness, it would be almost fully relaxed, thereby preparing a compliant substrate template with arbitrary lattice constant combination on a common substrate.

Hereinafter, each embodiment in the specific applications of the preparation method for the crystal template provided by the invention is described in detail.

Embodiment 1: $In_{0.3}Ga_{0.7}As$ Template on a GaAs Substrate

Obviously, ternary $In_{0.3}Ga_{0.7}As$ template is applicable for the design of 1.55 µm InGaAs/InAlAs tele-communication lasers with optimal conduction band mismatch and high thermal stability. Since unstrained bulk material of $In_{0.3}Ga_{0.7}As$ has a band gap of 1 eV, it is suitable to be used as one of the junctions to form a multi junction solar cell with high efficiency.

According to the invention, the steps for growing $In_{0.3}Ga_{0.7}As$ by molecular beam epitaxy (MBE) technique are followed:

A GaAs buffer layer is grown on a GaAs substrate to smooth the surface, at the growth temperature of 580° C.

Through interfacial misfit dislocation array (IMF) method, AlSb or GaSb with a thickness of 0.5 micron (µm) is grown at the growth temperature of 500° C. to 520° C. By forming misfit dislocation array at the interface, the IMF method may achieve in effective strain relaxation, and ensure a low threading dislocation density (optimum value located in the order of $10^4$ $cm^{-2}$) and smooth surface.

By IMF method, InSb layer with a thickness of a several nanometers (nm) is grown at the growth temperature of 230. By reflection high energy electron diffraction (RHEED), we found that the RHEED pattern of the InSb turns to strip after the growth of ten monolayers, which indicates the surface is quite smooth and two-dimensional growth mode.

Raising the growth temperature to 280° C., GaAs layer is sequentially grown with a thickness of 3 nm to 5 nm by IMF method. According to the RHEED observation, the GaAs layer is almost fully relaxed, and has smooth surface.

An $In_{0.3}Ga_{0.7}As$ template layer is grown with a thickness of 6 nm to 10 nm at the same temperature (280), the $In_{0.3}Ga_{0.7}As$ template layer is fully strained relative to the GaAs layer below.

Raising the growth temperature to 530° C. or even higher, the InSb layer is melted and then converted to a liquid state with low viscosity. It needs to note that, the step for melting InSb layer can be conducted by molecular beam epitaxy (MBE) or metal organic vapor phase epitaxy (MOVPE). When conducted by MOVPE, the temperature for growing $In_{0.3}Ga_{0.7}As$ is generally higher than 530° C.

$In_{0.3}Ga_{0.7}As$ is sequentially grown on the GaAs compliant template on the InSb liquid. Herein, according to the thickness of the GaAs layer, it can be divided into two situations: first situation, under the condition of thin GaAs layer (around or below 3 nm), the $In_{0.3}Ga_{0.7}As$ layer would be ultimately elastically and fully relaxed to the lattice constant of its bulk material. Second situation, under the condition of thick GaAs layer (above 3 nm), the $In_{0.3}Ga_{0.7}As$ layer is plastically relaxed by forming misfit dislocations at the $In_{0.3}Ga_{0.7}As$/GaAs interface. Since the thickness of the $In_{0.3}Ga_{0.7}As$ is greater than that of the GaAs layer, the generated threading dislocations would thread downward to the liquid InSb layer. In both situations above, the relaxed $In_{0.3}Ga_{0.7}As$ layer barely contain structural defects. It should be noted that, when use molecular beam epitaxy (MBE) technique at the temperature of 530° C., the surface of $In_{0.3}Ga_{0.7}As$ would become unstable due to the desorption and the surface diffusion of In atoms. As a result, it would help to protect the surface of $In_{0.3}Ga_{0.7}As$ layer by depositing a thin GaAs layer. After the melting of the InSb layer, the growth temperature is decreased to about 505° C. to 510° C., and the remaining $In_{0.3}Ga_{0.7}As$ is sequentially grown until the achievement of fully relaxation.

Embodiment 2: InP Template on a Si Substrate

Constructing InP template on a Si substrate is very attractive for Si-based optoelectronic integrated circuit. When growing III-V elements on Si, the Si substrate usually has a few degrees of off-cut along the [1-10] crystal direction to eliminate anti-phase domain (APD). Various III-V buffer layers can be grown on a Si substrate. Herein, we chose AlSb, which has the same thermal expansion coefficient with Si, thereby avoiding the formation of cracks during the cooling process. We found that AlSb can be grown on a Si substrate with off-cut angles by the similar way of IMF method.

The specific process includes:

Depositing 20 monolayers (MLs) of AlSb on a Si substrate at 320, till showing a standard strip of RHEED pattern, which means a relatively smooth surface. The surface can be further improved by depositing a thin layer of GaSb or short-period superlattice of GaSb/AlSb, wherein each GaSb layer should be sufficiently thin (<3 nm), as it would be melted afterwards. The AlSb layer prior to the last GaSb layer (<3 nm) should be relatively thick (at least tens of nanometers).

After that, there are two ways to grow InP template on the GaSb layer. The first method is: firstly, grow partial relaxed InP thin layer (>10 nm) by low-temperature IMF method; then, perform thermal annealing at the temperature slightly above the melting point of GaSb (712), and the residual strain in InP would ultimately drives the threading dislocations to the edge of the sample or annihilates one another, which is identical to the previous discussion. The second method is: firstly, grow partial relaxed $In_xGa_{1-x}As$ (0.35<x<0.5) thin layer on the GaSb by IMF method; subsequently deposit InP thin layer with fully strain relative to the $In_xGa_{1-x}As$ thin layer; then sequentially grow InP (the process can be achieved by MOVPE) when the temperature is raised to slightly higher than 712; until the InP layer is sufficiently thick (depending on the thickness of $In_xGa_{1-x}As$ layer), it begins to relaxation, and the generated threading dislocations would penetrate downward through the $In_xGa_{1-x}As$ layer.

Embodiment 3: GaN and MN Templates on a (111) Si Substrate

In the Embodiment 3, firstly, an AlSb buffer layer is grown on a (111) Si substrate by IMF method, the relevant growth temperature and the flow of Sb/Al should be optimized to smoothen the surface.

Then, GaSb thin layer with a thickness of just a few nanometers is grown on the AlSb buffer layer.

Subsequently, the GaN layer or the AlN seed layer is grown at a certain optimized temperature below the melting point of GaSb. The GaN layer or the AlN seed layer has a thickness of nanometer order.

Finally, as the growth temperature is raised above the melting point of GaSb, GaN or AlN is sequentially grown till the required thickness is reached, to realize fully relaxation.

To sum up, the lattice mismatched crystal template and the preparation method thereof provided by the present invention is that, preparing a compliant substrate template with low dislocation density and arbitrary lattice constant combination on a normal substrate by using a thin melting buffer layer with low viscosity in the heteroepitaxial growth. Compared to the prior art, the invention has advantages of simple preparation, achieving in various lattice constant material combinations on one substrate and low dislocation density, high crystal quality.

The above embodiments are provided to schematically describe the principle and efficacies of the invention, but not to limit the invention. The above embodiments may be amended by technologists in this field without prejudice to the spirit and the scope of the invention. Therefore, the protective scope of the invention is list as in the claims.

What is claimed is:

1. A preparation method for a monolithic integrated lattice mismatched by using low-viscosity material, characterized in that, includes:

providing a first crystal layer with a first lattice constant;

growing a buffer layer on the first crystal layer, the buffer layer being grown at a temperature below its melting point on the first crystal layer;

below the melting point of the buffer layer, performing a first template layer growth process for a template layer, growing the template layer on the buffer layer, wherein the template layer has a second lattice constant, which differs from the first lattice constant of the first crystal layer;

melting and converting the buffer layer to an amorphous state, performing a second template layer growth process for the template layer at a growth temperature above a glass transition temperature of the buffer layer, the template layer is sequentially grown until the lattice of the template layer is fully relaxed.

2. The preparation method for the crystal template according to claim 1, characterized in that, prior to performing the first template layer growth process, further includes:

growing a second crystal layer on the buffer layer at a temperature below the melting point of the buffer layer, the second crystal layer has lattice mismatch relative to the buffer layer and is partially relaxed or strained.

3. The preparation method for the crystal template according to claim 2, characterized in that, a melting point of the buffer layer is lower than a melting point of any one of the first crystal layer, the second crystal layer and the template layer of the crystal template.

4. The preparation method for the crystal template according to claim 2, characterized in that, the total thickness of the second crystal layer and the template layer is greater than the thickness of the buffer layer.

5. The preparation method for the crystal template according to claim 4, characterized in that, the thickness of the second crystal layer is smaller than the critical thickness of the infinitely thick template layer, or ensure that dislocations generated at a interface between the second crystal layer and the template layer bend towards to the second crystal layer.

6. The preparation method for the crystal template according to claim 1, characterized in that, the buffer layer has a thickness of nanometer order, and is strained or partially or fully relaxed relative to the first crystal layer.

7. The preparation method for the crystal template according to claim 1, characterized in that, the step of melting the buffer layer and then converting to an amorphous state is achieved by either of the following ways:

a. raising the growth temperature to above the melting point of the buffer layer, such that the buffer layer melts and converts to an amorphous state;
b. selectively melting the buffer layer to convert to an amorphous state by employing an external laser.

8. The preparation method for the crystal template according to claim 1, characterized in that, the preparation method for the crystal template allows reuse during the same growth process.

9. The preparation method for the crystal template according to claim 1, characterized in that, the preparation method for the crystal template is achieved by any of epitaxial growth methods including molecular beam epitaxy (MBE), metal-organic vapor phase epitaxy (MOVPE), liquid phase epitaxy (LPE), hot wall epitaxy (HWE), and modified deposition modes including droplet epitaxy, migration enhanced epitaxy, atomic layer epitaxy, and sputtering, pulsed laser deposition, and other crystal deposition technologies by using evaporation element or ion beam.

* * * * *